US011735464B1

(12) United States Patent
Hackler, Sr. et al.

(10) Patent No.: US 11,735,464 B1
(45) Date of Patent: Aug. 22, 2023

(54) METHOD OF DEMOUNTING THIN SEMICONDUCTOR DEVICES

(71) Applicants: Douglas R. Hackler, Sr., Boise, ID (US); Randall S. Parker, Boise, ID (US)

(72) Inventors: Douglas R. Hackler, Sr., Boise, ID (US); Randall S. Parker, Boise, ID (US)

(73) Assignee: American Semiconductor, Inc., Boise, ID (US)

( * ) Notice: Subject to any disclaimer, the term of this patent is extended or adjusted under 35 U.S.C. 154(b) by 147 days.

(21) Appl. No.: 17/407,760

(22) Filed: Aug. 20, 2021

Related U.S. Application Data

(60) Provisional application No. 63/068,914, filed on Aug. 21, 2020.

(51) Int. Cl.
*H01L 21/683* (2006.01)

(52) U.S. Cl.
CPC ...... *H01L 21/6836* (2013.01); *H01L 2221/68336* (2013.01); *H01L 2221/68354* (2013.01); *H01L 2221/68386* (2013.01)

(58) Field of Classification Search
CPC .......... H01L 21/67132; H01L 21/6836; B32B 43/006; B32B 38/10; G03C 1/74
See application file for complete search history.

(56) References Cited

U.S. PATENT DOCUMENTS

2010/0043608 A1* 2/2010 Jakob ............... H01L 21/6836
156/247

\* cited by examiner

*Primary Examiner* — Brian Turner
(74) *Attorney, Agent, or Firm* — Your Intellectual Property Makers, LLC; Robert A. Frohwerk

(57) ABSTRACT

The described method enables removal of any flexible material from a temporary carrier for transfer to another surface. In particular, a semiconductor wafer is commonly held by a temporary adhesive to a carrier substrate for support during a variety of processing steps, including thinning of the semiconductor device layer. Subsequent to processing, the described method attaches the ultra-thin device layer to a roll of tape for removal from the temporary adhesive, followed by transfer to a demount roller, which then releases it onto a desired permanent surface. Utilizing the flexible nature of the ultra-thin device layer, the sequence of rollers is able to peel it from the temporary adhesive without any need for laser release processing or chemical adhesive removal while maintaining the thinned wafer in a planar form during processing. This transfer supports operations that include a change of orientation, such as from face up to face down.

20 Claims, 8 Drawing Sheets

METHOD OF DEMOUNTING THIN SEMICONDUCTOR DEVICES

CROSS-REFERENCES TO RELATED APPLICATIONS

This application claims benefit of U.S. Provisional Application No. 63/068,914, entitled "Method of Demounting Thin IC Devices", which was filed 21 Aug. 2020, and which is incorporated here by reference in its entirety.

U.S. Pat. No. 9,082,881, entitled "Semiconductor on Polymer Substrate", is incorporated here by reference in its entirety.

FIELD OF THE INVENTION

The present invention relates generally to a method for handling semiconductor wafers. In particular, the described method provides support for thinning semiconductor wafers to make them flexible, followed by additional processing through singulation and packaging of individual dice.

BACKGROUND OF THE INVENTION

A wide variety of applications require wafers of silicon or other semiconductor materials as well as similar hard brittle materials to be thinned to thicknesses that do not allow them to be subsequently processed without some type of mechanical support or mounting. In the case of silicon wafers, systems such as the Wafer Support System (WSS) devised by 3M™, temporarily mount wafers onto carriers made of glass with temporary adhesives. The glass carrier provides stability while the wafer is thinned using mechanical or chemical means. This type of temporary mounting process is highly useful in the thinning of silicon materials as, it is important to note, when silicon wafers or other brittle materials are aggressively thinned they become very fragile.

The WSS system and other temporary mounting systems rely on laser or thermal processing to gently remove the carrier from the temporary adhesive. Then the temporary adhesives are mechanically peeled or chemically dissolved to remove them from the fragile thin silicon wafer while it is supported on a vacuum chuck or similar holder that maintains rigidity to avoid cracking.

Recent innovations in ultra-thin wafer processing have resulted in silicon wafers being thinned to such an extreme, less than 20 um, that they become flexible. In fact, it has been demonstrated that materials that are considered extremely brittle become highly flexible with they are extremely thin.

Existing techniques for removal of these materials from the carrier substrate and temporary adhesive used in the thinning process are problematic due to the difficulty of holding the ultra-thin wafer during the adhesive peeling or during chemical processing. Additionally, the lack of capability to handle the flexible material after a successful peel or chemical process without uncontrolled deformation creates new handling issues that are not within the capability of conventional automated wafer handling systems necessary for the next steps in standard processing sequences such as dicing and test.

BRIEF SUMMARY OF THE INVENTION

The methods described here provide a highly efficient chemical-free release of ultra-thin semiconductor wafers and other similar brittle materials from carriers. Unlike existing technology that relies on substrates to be supported and remain planar during the removal of carriers and temporary mounting adhesives, the methods described here utilize the flexible nature of ultra-thin materials, peeling them from the temporary adhesive without requiring removal of the carrier substrate prior to removal of the temporary adhesive or removal of the temporary adhesive from the carrier substrate. This method eliminates the need for laser release processing, thermal adhesive release and for chemical adhesive removal. Additionally, there is no longer a need to maintain the ultra-thinned wafer in a planar form during processing. Described methods may be chosen to leave the ultra-thinned wafer oriented with its frontside either up or down.

BRIEF DESCRIPTION OF THE DRAWINGS

The particular features and advantages of the described method will become apparent from the following description taken in conjunction with the accompanying FIGS. 1-18 of the drawings.

The following Reference Numbers may be used in conjunction with one or more of the accompanying FIGS. 1-18 of the drawings:

10 Device Wafer
14 Temporary Adhesive

16 Carrier Wafer
20 Ultra-Thinned Device Layer
30 Holder, Vacuum Chuck
40 Tape Roller
50 Adhesive Tape
52 Non-Adhesive area of Tape
56 Tape, cut edge
60 Demount Roller
62 Idler Roller
64 Detachment Roller
70 Supporting Frame
72 Frame, outer edge
74 Frame, inner edge
80 second tape

DETAILED DESCRIPTION OF THE INVENTION

The processes described here are well suited to handling of thin brittle materials, especially of semiconductor wafers, such as silicon in CMOS (Complementary Metal-Oxide Semiconductor). The preferred use is in the demounting of thinned CMOS wafers from temporary carriers, but the method can be used to remove any flexible material from a temporary carrier. Whereas the industry standard is to remove the carrier and adhesive from the product wafer, the presently described method takes the opposite approach, pulling the device from the temporary mounting. A primary advantage of the described method is that it is simple and quick; it can be implemented by modification of simple wafer taping tools. This method allows more robust bonding of temporary adhesive to the carrier and allows a wider variety of methods to be used to remove the adhesive from the carrier for reuse of the carrier.

Figure 1:
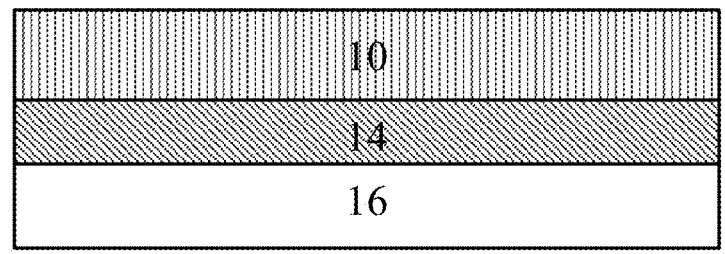
FIG. 1 depicts a generic device starting wafer attached temporarily to a carrier substrate by a temporary adhesive.

The described method of demounting devices begins as shown in FIG. 1 with a Device Wafer 10. A Carrier Wafer 16 supports the Device Wafer 10 which is held in place by a Temporary Adhesive 14. This industry standard configuration is necessary to keep the Device Wafer 10 stable during processing, especially when it is to be aggressively thinned. For the process described here, thinning makes a brittle material, such as a silicon CMOS wafer, flexible.

Fabricated semiconductor wafers, such as silicon wafers common to CMOS technology, typically include bond pads on the surface of the wafer for connection to devices external to the subject IC (Integrated Circuit). This is the side of the wafer that is commonly referred to as the frontside of the wafer, the backside of the wafer typically being the reverse side. The backside of the wafer is the side from which material is removed during thinning operations such as wafer grinding.

Removal of the bulk of the Device Wafer 10 reduces it to an ultra-thinned Device Layer 20, which retains essential circuitry and little more. For CMOS wafers, the silicon thickness should be less than 20 um, although an alternative is to singulate, by cutting or dicing or another equivalent operation, the individual die prior to tape demount.

Figure 2:
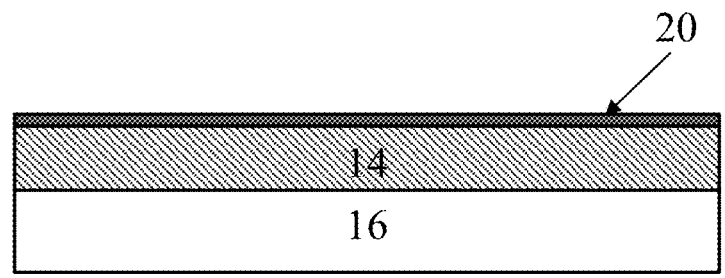
FIG. 2 illustrates FIG. 1 after thinning of the generic device starting wafer.
Figure 3:
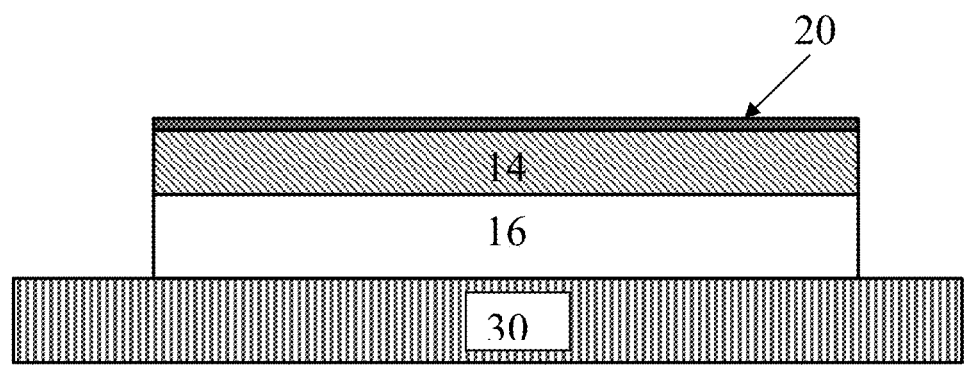
FIG. 3 shows the assembly of FIG. 2 as secured by a vacuum chuck or similar holder for support.
Figure 4:
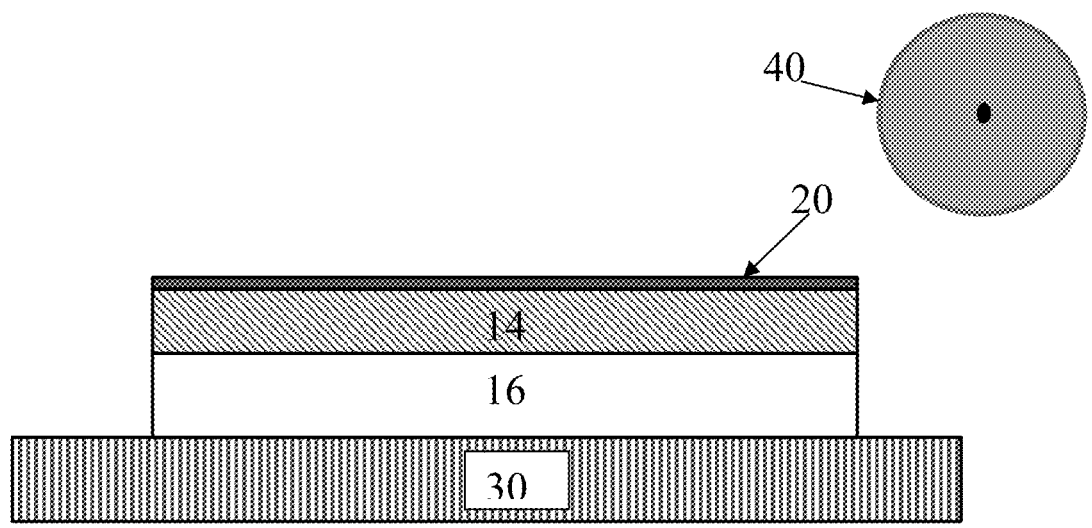
FIG. 4 shows the assembly of FIG. 3 in a ready state prior to application to a roll of tape.
Figure 5:
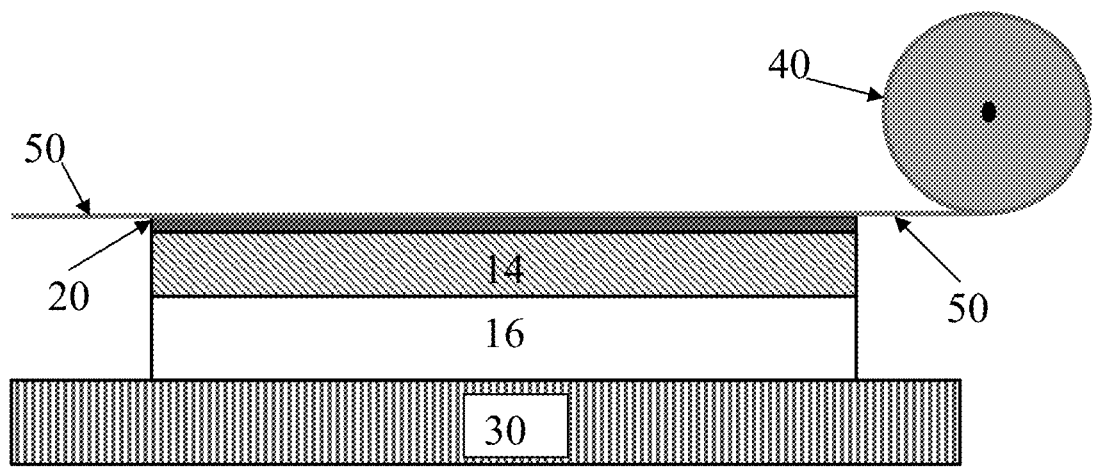
FIG. 5 illustrates the assembly of FIG. 4 subsequent to application to a tape from a roll.

FIG. 2 depicts the Device Layer 20 as it remains adhered to the Carrier Wafer 16. After a wafer has been ultra-thinned to its final thickness, a variety of post-thinning processing is often desirable. This may include, but is certainly not limited to, the application of polymers; and to the formation of backside vias; and/or redistribution layers (RDL). A backside polymer may be applied to improve reliability, especially using the particular Semiconductor-on-Polymer (SoP) method as described in U.S. Pat. No. 9,082,881. Vias are sometimes useful for backside connections, and a backside RDL is an innovation for advanced IC packaging wherein an extra metal layer is added to an IC to relocate I/O (Input/Output) pads to be more readily available in other locations of the chip, for better access or for heat distribution.

For continued processing the Device Layer 20, mounted on the Carrier Wafer 16, is placed on a Holder 30 (FIG. 3), typically a vacuum chuck. A Tape Roller 40 (FIG. 4) rolls an Adhesive Tape 50 (FIG. 5) onto the exposed surface of the Device Layer 20 which remains mounted on the Carrier Wafer 16 with Temporary Adhesive 14. Though the present process uses a roller to apply the tape to the thin device layer, application of the tape by a manner other than rolling would still be compatible with the presently described method of demount.

Suitable adhesive tapes are selected from dicing tapes and can be UV or thermally releasable. Such tapes can have higher adhesion than temporary adhesives. The Adhesive Tape 50 provides a flexible medium that adheres strongly to the Device Layer 20. It is necessary that the wafer be held securely so that the Adhesive Tape 50 is applied evenly, and so that the Carrier Wafer 16 does not break when peeling force is applied to the thin device layer being peeled away.

Figure 6:
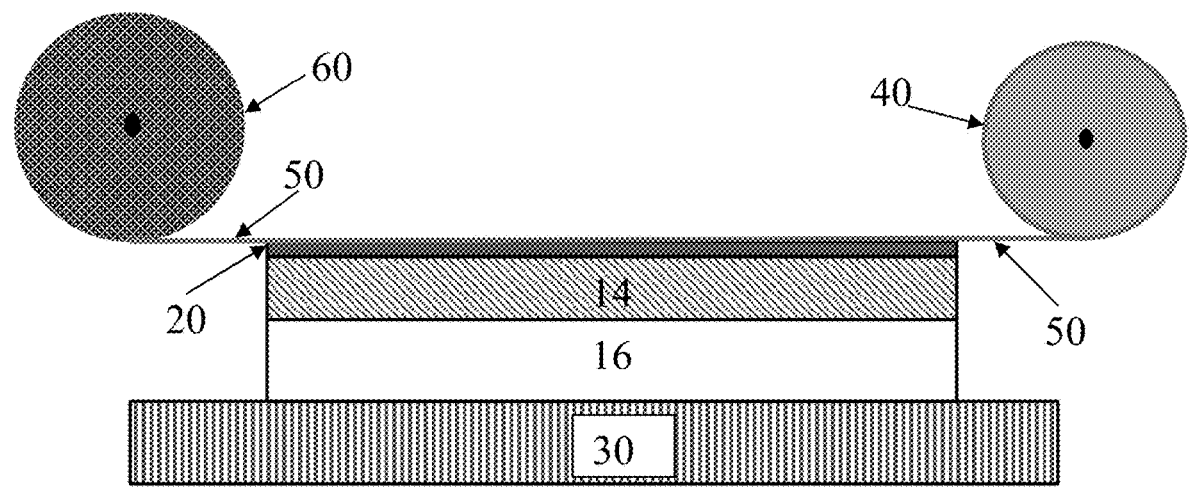
FIG. 6 depicts the attachment of the tape of FIG. 5 to a demount roller.
Figure 7:
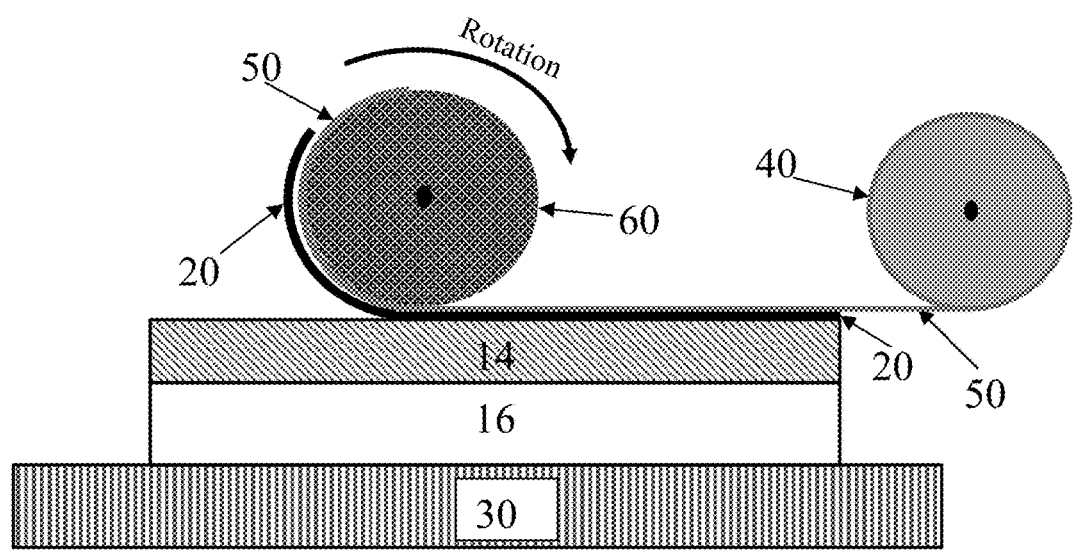
FIG. 7 illustrates the tape of FIG. 6 as rotation of the demount roller separates the thinned device layer from the temporary adhesive.

Following this setup, the actual demount process begins at FIG. 6 with the introduction of Demount Roller 60 which is attached to pick up Adhesive Tape 50. The Demount Roller 60 is rotated in FIG. 7 to roll across the Device Layer 20, maintaining a known and well-controlled radius of curvature. The Adhesive Tape 50 is selected to have greater adhesion than the Temporary Adhesive 14 in order to assure that the Device Layer 20 adheres to the Adhesive Tape 50 so that it will be rolled off of the Temporary Adhesive 14 onto Demount Roller 60 rather than remaining attached to the Temporary Adhesive 14 after rolling.

Figure 8:
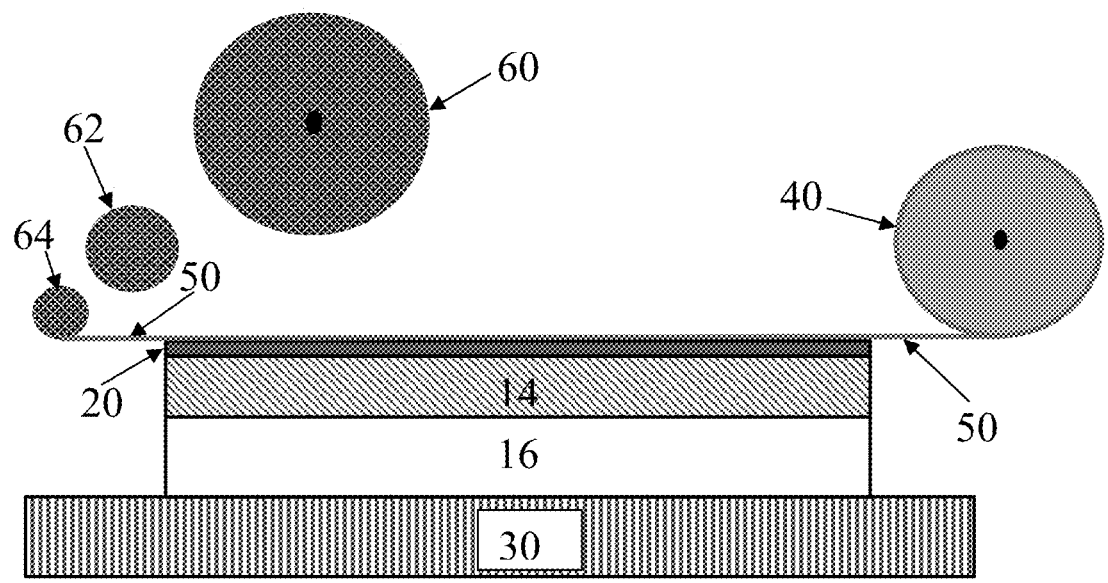
In FIG. 8 depicts a detachment roller positioned for attachment to the tape, with an optional idler roller.
Figure 9:
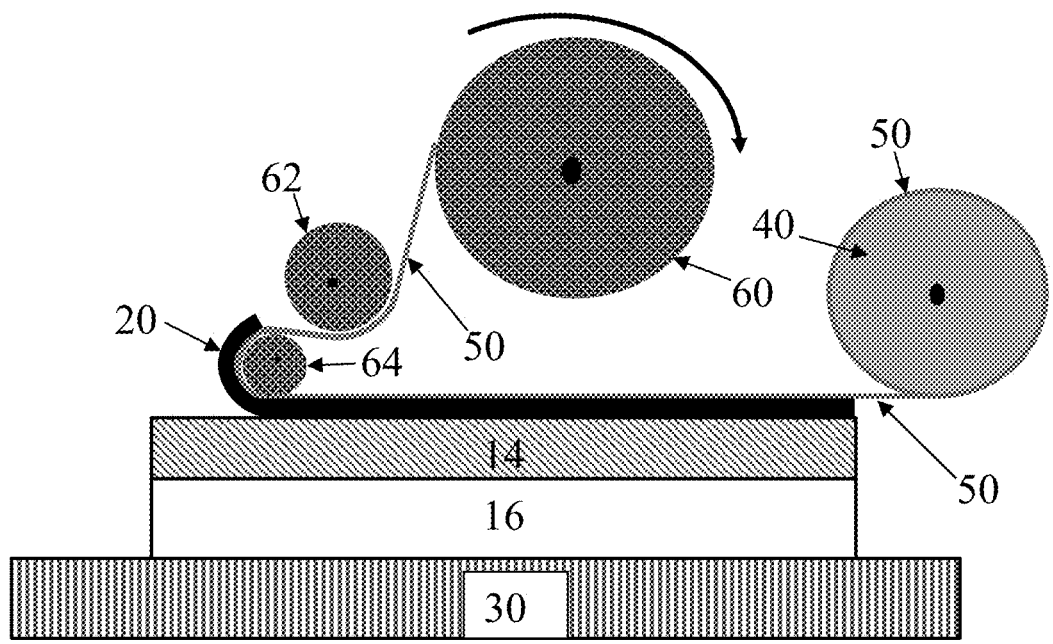
FIG. 9 shows the tape being picked up by the demount roller after the thinned device layer has been detached from the temporary adhesive by the detachment roller prior to passing an optional idler roller.
Figure 10:
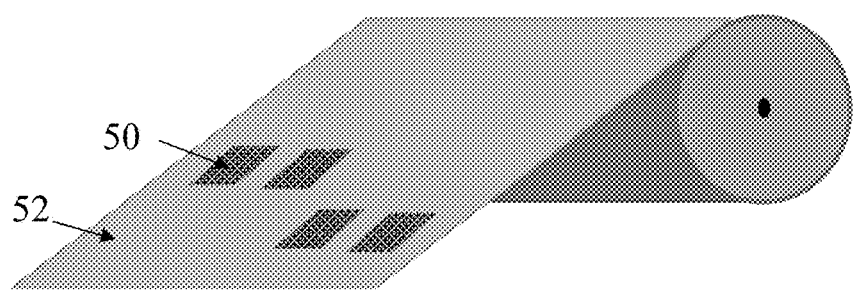
FIG. 10 illustrates a tape that is patterned with areas of adhesive and non-adhesive for selective detachment of chosen regions of the thinned device layer.

It is essential that the diameter of the Demount Roller 60 be properly selected as it will vary in order to optimize processing. It is clearly advantageous to size the Demount Roller 60 with a diameter sufficiently large that its circumference will accommodate removal of the entire ultra-thinned Device Layer 20 attached to the tape without wrapping around onto itself. However, it must be taken into account that the roller diameter determines the peel angle of the tape and therefore the amount of force applied during demount. A roller of sufficiently large diameter to assure that the tape does not wrap onto itself may not provide adequate force. In such case multiple rollers may be used, as shown in FIG. 8 and FIG. 9, with a Detachment Roller 64 having a smaller diameter providing the needed force nearer the detachment zone backed up by the Demount Roller 60 as a larger diameter takeup roller for capture of the Device Layer 20. One or more Idler Rollers 62 may be inserted between the Detachment Roller 64 and Demount Roller 60 to maintain tension and to accommodate other mechanical path considerations.

A variety of roller materials and roller hardnesses are available. All rollers should be made of a material that is compatible with the device being demounted. For CMOS wafers, it is desirable for rollers to have a cushioned surface that is static dissipative to avoid risk of impingement damage and buildup of a static charge.

Also to be noted is that diameters of the rollers establish the radius of curvature to which the device layer is exposed during the tape demount process. The speed and force of the taping and rolling operation affects the necessary size of the tape as well as the amount of stretch of the tape during demount.

The tape demount can be done pre- or post-dicing. Partially patterned adhesive tapes, or precut decals, that include localized non-adhesive areas (52) like the tape surface shown in FIG. 10 can be used to demount selective areas of a diced thin device layer. When the demount operation occurs after dicing it is sometimes beneficial to allow for stretching of the tape in order to provide increased space between one die and another. The roller shape may be modified with flat spots equivalent to diced device dimensions.

Figure 11:
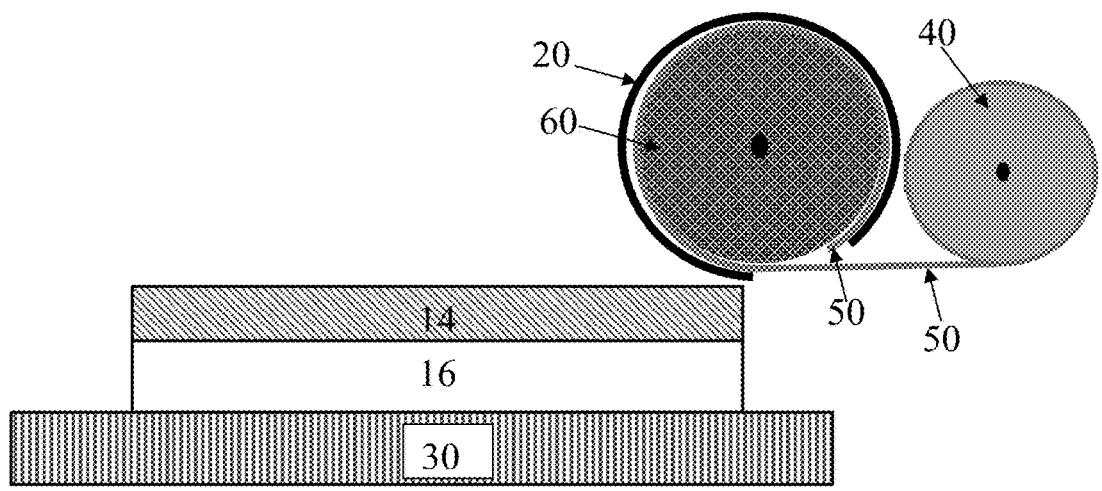
in FIG. 11 the thinned device layer has been completely released from the temporary adhesive onto the roller.

At FIG. 11 the entire ultra-thinned Device Layer 20 is shown attached to the Adhesive Tape 50 which has been wrapped around the Demount Roller 60. At this point the Holder 30 releases the no longer needed Carrier Wafer 16 with the applied Temporary Adhesive 14 as depicted in FIG. 12.

Having the ultra-thinned Device Layer 20 isolated onto the Demount Roller 60 leaves open a variety of options. One very simple possibility is to reverse the direction of rotation of the Demount Roller 60 to transfer the flexible ultra-thinned Device Layer 20 as-is directly to the surface of a final product, including planar and cylindrical objects. Candidates here include, but are certainly not limited to, a wine bottle or a pharmaceutical vial.

Figure 12:
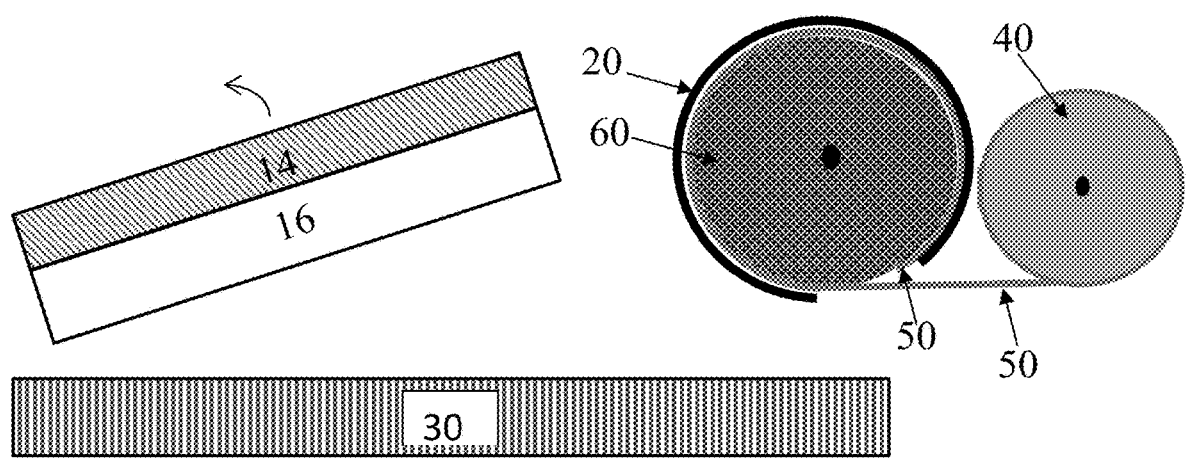
FIG. 12 shows removal of the carrier substrate with the temporary adhesive from the holder following release of the thinned device layer onto the tape on the demount roller.
Figure 13:
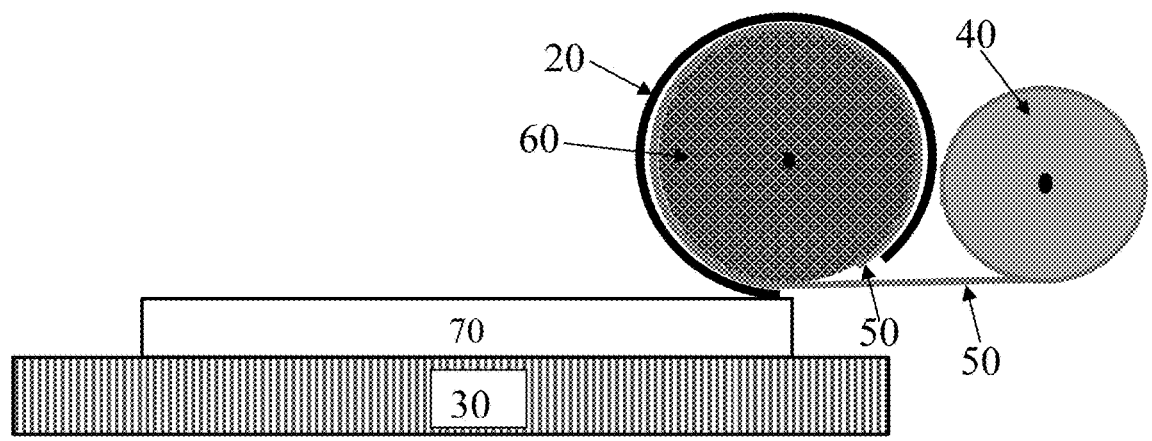
in FIG. 13 a frame is placed on the holder to receive the released thinned device layer from the demount roller.
Figure 14:
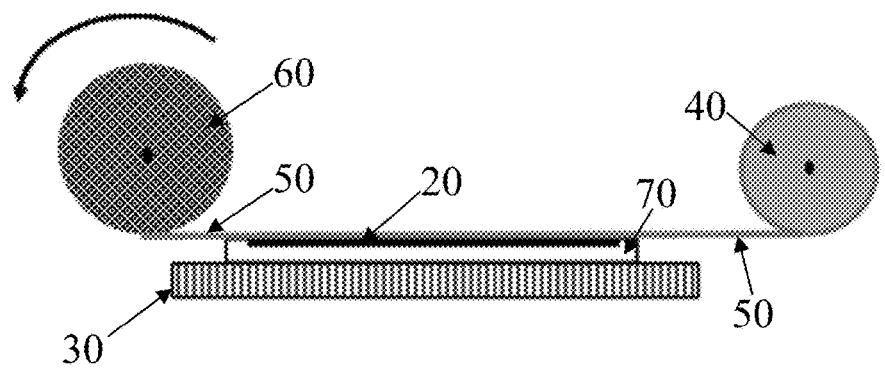
FIG. 14 depicts a reverse rotation of the demount roller to apply the thinned device layer to the frame.

Typically processing will continue with the release of temporary items, such as the Carrier Wafer 16 with the applied Temporary Adhesive 14, as seen in FIG. 12. This leaves the Holder 30 open to receive a Supporting Frame 70, as shown in FIG. 13. This may be, among other possibilities, a dicing ring or similar fixture.

As the rotation of the Demount Roller 60 is reversed (FIG. 14), the ultra-thinned Device Layer 20 is rolled-onto the Supporting Frame 70 without creasing or wrinkling the Adhesive Tape 50 or the attached flexible ultra-thinned Device Layer 20. At this point in the process, downward force may be applied to the Demount Roller 60 or a secondary roller could be added to apply force to stick tape onto the Supporting Frame 70.

Figure 15:
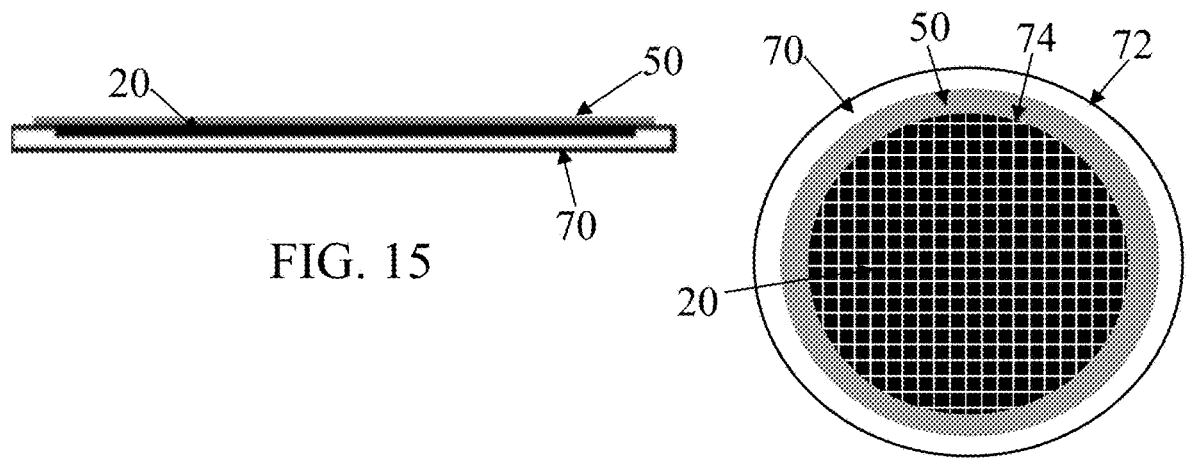
FIG. 15 and FIG. 16 are, respectively, edge and top views of the thinned device layer after it has been attached to the frame and released from the vacuum chuck or similar holder in FIG. 17 the thinned device layer on the first tape is held by a vacuum chuck as a second tape is rolled over the frame.
Figure 16:
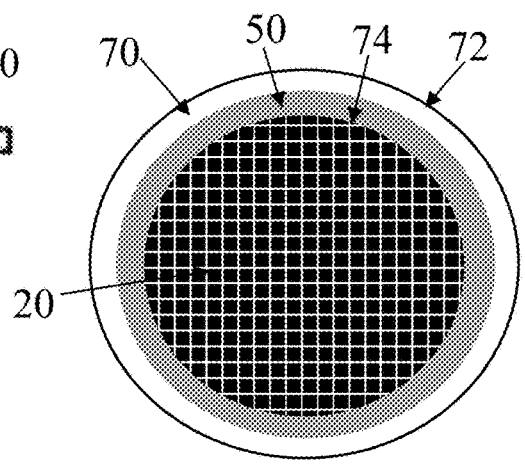

The Adhesive Tape 50 is then trimmed around the perimeter (outer edge 72) of the Supporting Frame 70 to release the taped frame from the roll leaving the Device Layer 20, within the inner edge 74 of the Supporting Frame 70, covered with the Adhesive Tape 50, as shown in the tape-on-frame side view of FIG. 15. Looking upward into FIG. 15, through the Supporting Frame 70, reveals the frontside view as seen in FIG. 16. This is the format typically used for high volume dicing, testing, and pick and place assembly operations, and it is achieved without any additional operations and their associated cost and effort, and risk of accidental damage.

The tapes used here are typically UV (Ultra-Violet) release or thermal release tapes. Heat or cold may be applied at any step of the described process as needed. The tapes must be of sufficient width to fully cover the maximum diameter or width of the layer being released from the temporary carrier. The described tape release method is also referred to as Tape Demount. Where the method is described as using tapes, a film or foil could be used as well.

Release of thin devices from tape post singulation is a challenging problem in the industry. Thermal tape provides an efficient release mechanism for pick and place of ultra-thin and flexible die. Tapes made for UV release are common and can also be used, but have not proven as beneficial for thin flexible die. Covering the entire wafer surface with tape ensures a complete demount. As an alternative, tape can be applied locally to selectively demount limited areas of the wafer, something that is beyond the capability of current technology. An alternative to the use of tape is to apply a vacuum to the surface of rollers to accomplish selective attachment and release throughout the demount process. For instances in which a device cannot be sufficiently thinned to achieve suitable flexibility, a demount roller may be constructed with facets (small planar surfaces) to allow an inflexible die to be demounted without flexion. Another option for minimizing flexion is a cutaway version of a demount roller that is an arc segment of a roller having a diameter that is large relative to dimensions of the device and of the supporting carrier substrate.

The result of the tape demount method described up to this point leaves the ultra-thinned Device Layer 20 mounted on Adhesive Tape 50 as shown in FIG. 15 and FIG. 16 with devices in the frontside-up orientation. It is sometimes desirable to have devices on the tape in a frontside-down orientation. Another version of the tape demount process can accomplish this, either in conjunction with the above described method or independent of it.

Reorientation of the ultra-thinned Device Layer 20 begins by placing the frontside-up mounted device with the Adhesive Tape 50 in contact with the Holder 30. This may be as a result of the above-described operations through FIG. 14, or it may be a new placement.

Figure 17:
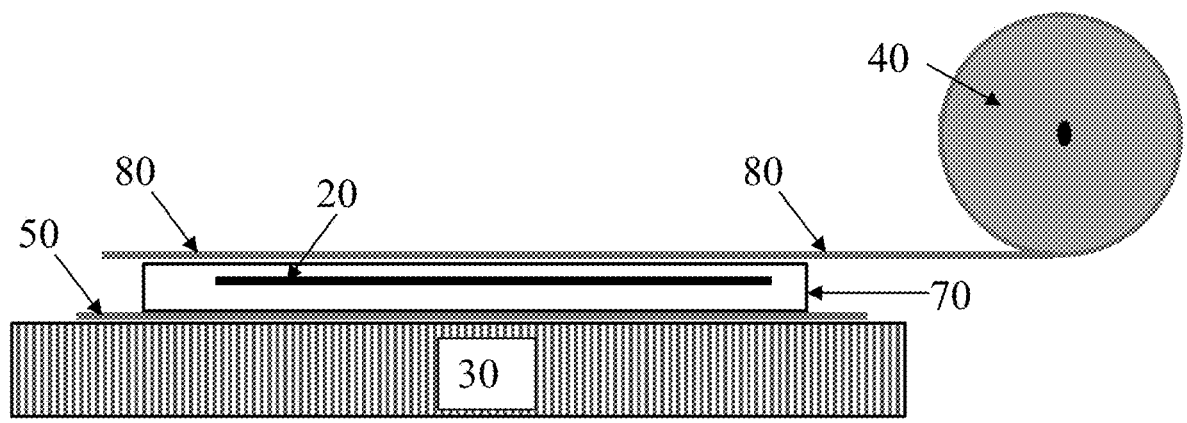
Figure 18:
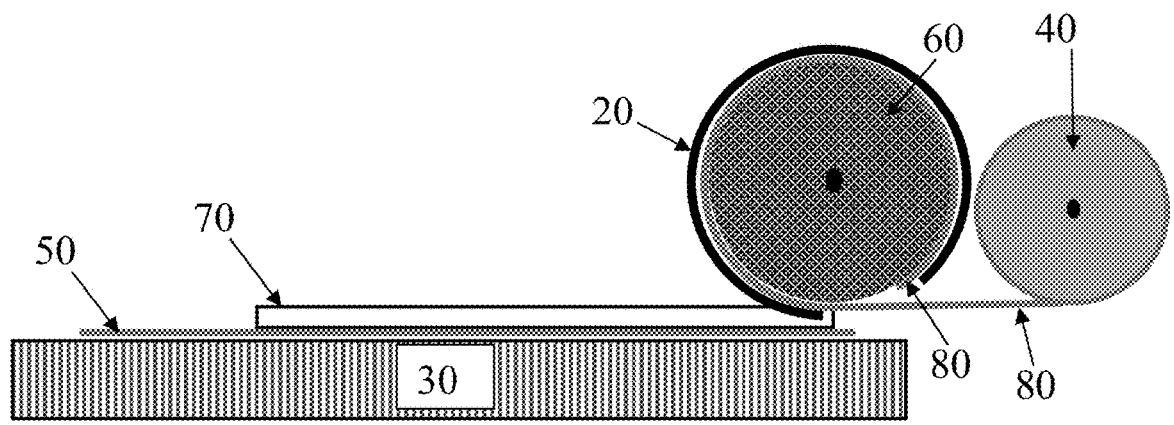
FIG. 18 shows the second tape as the demount roller lifts the inverted thinned device layer from the frame.

A second tape 80 is then applied over the surface of the tape device on-frame and applied with adhesive to the frontside-up surface of the waferscale ultra-thinned Device Layer 20, as shown in FIG. 17. Thermal tapes of different thermal release temperatures can be highly effective for this transfer. The thin device layer is then peeled (FIG. 18) from the tape-on-frame in the same manner as demounting from a carrier (as 16). The result of demounting from tape-on-frame is that the wafer is mounted in the opposite orientation as when pulled from the carrier. The resulting second tape demounted device on-frame will be in the opposite, frontside-down, orientation. This tape transfer utilizes two tapes, a first, Adhesive Tape 50, and a second tape 80, having different adhesion release characteristics. The two tapes may have different temperature releases, adhesive strengths, or the two tapes may vary in other release capabilities, such as one being UV-releasable while the other is thermally releasable, such options being common and readily available among dicing tapes. Adhesion of one tape on another can be eliminated in the areas between the wafer and the frame by application of a low stick liner such as a Teflon or Tyvek sheet. A vacuum roller may also be used in place of tape.

Although dicing and mounting tapes are known and well understood, they have previously not been used as a peel layer for transfer of ultra-thin materials. They are also not known for being used without a frame. Typically a thinned device wafer would be held and a carrier removed, whereas in the presently described method the carrier is held while the thinned device wafer is separated from the temporary adhesive which is then discarded along with the carrier. Manipulation of device layers by using rollers in the operations as described becomes possible when the device layer is suitably thin, where thinning makes even brittle materials flexible.

Although flexible wafers are preferred for this method, if rigid devices are singulated such that they roll in a manner similar to a chain, the described demount method is still applicable even though the individual die may not be flexible. Undiced wafers may be processed using this method with modification or replacement of the roller to a suitable geometry.

For devices that are singulated it may be desirable to add a mechanism to stretch the tape in both x- and y-directions when rolling the tape onto the frame. This would have the effect of separating the dice to provide more surrounding space for access by subsequent operations. Devices that remain inflexible, because they cannot be thinned sufficiently, may be accommodated by partial singulation such that the inflexible die remain attached to one another with a flexible material.

The methods described here support high-volume production at reduced cost. The temporary mounting on the carrier substrate and transfer to a dicing tape in either frontside-up or frontside-down orientation, enables the use of high-volume wafer processing equipment up to the point of processing singulated die. Low-cost wafer processing can be used throughout the entire fabrication.

What is claimed is:

1. A method of demounting a device from a supporting carrier substrate, the method comprising:
   fixing the device along with the supporting carrier substrate to a holder;
   applying an adhesive tape to the device;
   rolling the adhesive tape onto a demount roller to separate the device from the supporting carrier substrate;
   removing the supporting carrier substrate from the holder;
   placing a supporting frame onto the holder; and
   adhering the adhesive tape, to which the device is attached, to the supporting frame.

2. The method of claim 1, wherein the device is a semiconductor wafer.

3. The method of claim 1, wherein the device is a product of a Semiconductor-on-Polymer (SoP) method described in U.S. Pat. No. 9,082,881.

4. The method of claim 1, wherein the device is singulated into separate die prior to demounting.

5. The method of claim 4, wherein the adhesive tape is patterned to include localized non-adhesive areas to demount selective areas of individual singulated die.

6. The method of claim 4, wherein the demount roller has facets which allow an inflexible die to be demounted without flexion.

7. The method of claim 4, wherein the adhesive tape carrying devices that have been singulated is stretched in X- and Y-directions prior to adhesion to the supporting frame so as to increase separation between singulated die.

8. The method of claim 4, wherein the singulated die are released directly onto a surface of a final product.

9. The method of claim 1, wherein a detachment roller having a diameter smaller than that of the demount roller is positioned to establish a peel angle to generate force to remove the adhesive tape with the device from the carrier substrate prior to being transferred to the demount roller.

10. The method of claim 9, wherein inserting one or more Idler rollers between the detachment roller and the demount roller maintains tension on the adhesive tape between the detachment roller and the demount roller.

11. The method of claim 1, wherein a second tape is applied to a surface of the device opposite the adhesive tape, and wherein the second tape has an adhesion release characteristic that is different from that of the adhesive tape, so that the device is separated from the adhesive tape to be transferred in an inverted orientation by adhering the second tape to the supporting frame.

12. The method of claim 1, wherein the adhesive tape is selected from a film or a foil.

13. The method of claim 1, wherein the adhesive tape is a precut decal attached to the device.

14. The method of claim 1, wherein the adhesive tape is replaced by a vacuum roller.

15. The method of claim 1, wherein the demount roller is an arc segment of a roller having a diameter that is large relative to dimensions of the device and of the supporting carrier substrate, thus minimizing flexion of the device.

16. The method of claim 1, wherein the device is made flexible by partial singulation of inflexible die such that the inflexible die remain attached to one another with a flexible material.

17. The method of claim 16, wherein the device is singulated into separate die prior to demounting, and
   wherein the adhesive tape is replaced by a vacuum roller having selectable zones to allow for selective demount of individual singulated die.

18. The method of claim 1, further comprising:
   applying the adhesive tape simultaneously to the device and to the supporting frame;
   attaching the carrier substrate to the holder; and
   lifting an edge of the supporting frame to allow the device to be demounted from the carrier substrate.

19. A method of demounting a device wafer, comprising:
   acquiring a device wafer;
   applying a temporary adhesive to the device wafer;
   bonding the device wafer with the temporary adhesive to a carrier substrate;
   thinning the device wafer to produce a thinned device wafer;
   placing the carrier substrate onto a holder;
   rolling an adhesive tape from a roll of adhesive tape onto an exposed surface of the thinned device wafer;
   attaching the adhesive tape to which the thinned device wafer is adhered to a demount roller; and
   rotating the demount roller in a first direction to remove the thinned device wafer from the temporary adhesive to the demount roller;
   placing a frame onto the holder; and
   rotating the demount roller in a second direction opposite that of the first direction to release the thinned device wafer and the adhesive tape onto a frame.

20. A method of demounting a device wafer, comprising:
   acquiring a device wafer;
   applying a temporary adhesive to the device wafer;
   bonding the device wafer with the temporary adhesive to a carrier substrate;
   thinning the device wafer to produce a thinned device wafer;
   placing the carrier substrate onto a holder;
   rolling an adhesive tape from a roll of adhesive tape onto an exposed surface of the thinned device wafer;
   attaching the adhesive tape to which the thinned device wafer is adhered to a demount roller; and
   rotating the demount roller in a first direction to remove the thinned device wafer from the temporary adhesive to the demount roller;
   providing a second tape;
   rotating the demount roller in a second direction opposite that of the first direction, to transfer the thinned device wafer to the second tape; and
   removing the adhesive tape,
   whereby the thinned device wafer is in an inverted orientation.

* * * * *